United States Patent
Leung (10) Patent No.: US 6,642,877 B2
(45) Date of Patent: *Nov. 4, 2003

(54) METHOD OF FORMING D/A RESISTOR STRINGS WITH CROSS COUPLING SWITCHES

(75) Inventor: Ka Y. Leung, Austin, TX (US)

(73) Assignee: Cygnal Integrated Products, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/217,659

(22) Filed: Aug. 13, 2002

(65) Prior Publication Data

US 2002/0186158 A1 Dec. 12, 2002

Related U.S. Application Data

(63) Continuation of application No. 09/584,217, filed on May 31, 2000, now Pat. No. 6,433,717.

(51) Int. Cl.[7] .............................................. H03M 1/66
(52) U.S. Cl. ....................................... 341/144; 341/154
(58) Field of Search ................................ 341/144, 154, 341/155

(56) References Cited

U.S. PATENT DOCUMENTS

| | | | |
|---|---|---|---|
| 4,338,591 A | 7/1982 | Tuthill | 341/347 |
| 4,638,303 A | 1/1987 | Masuda et al. | 341/135 |
| 5,079,552 A | 1/1992 | Pelgrom et al. | 341/148 |
| 5,220,483 A | 6/1993 | Scott | 361/313 |
| 5,343,199 A | 8/1994 | Sugawa | 341/159 |
| 5,479,044 A | 12/1995 | Narahara et al. | 257/133 |
| 5,581,252 A | 12/1996 | Thomas | 341/144 |
| 5,619,203 A | 4/1997 | Gross, Jr. et al. | 341/144 |
| 5,675,269 A | 10/1997 | Nakauchi | 327/77 |
| 5,703,588 A | 12/1997 | Rivoir et al. | 341/159 |
| 5,731,775 A | 3/1998 | Gross, Jr. et al. | 341/155 |
| 5,744,385 A | 4/1998 | Hojabri | 438/238 |
| 6,157,335 A | 12/2000 | Suzuki et al. | 341/154 |
| 6,163,289 A | 12/2000 | Ginetti | 341/141 |
| 6,433,717 B1 * | 8/2002 | Leung | 341/144 |

OTHER PUBLICATIONS

A Monolithic Charge–Balancing Successive Approximation A/D Technique, Thomas P. Redfern, Joseph J. Connolly, Jr., Sing W. Chin and Thomas M. Frederiksen, IEEE, J. Solid State Circuits, vol. SC–14, pp. 912–920, Dec. 1979.

(List continued on next page.)

Primary Examiner—Peguy JeanPierre
(74) Attorney, Agent, or Firm—Gregory M. Howison; Howison & Arnott, LLP (57) ABSTRACT

A method is disclosed for forming resistor strings in a semiconductor material for a digital-to-analog converter having a main DAC resistor string and a sub-DAC resistor string. The main DAC resistor string is formed as two identical resistor strings connected in parallel and such that the bottom of one resistor string and the top of the other resistor string are connected to a first voltage. The other ends of the resistor strings are coupled to a second different voltage. A switch multiplexer serving two functions is connected between the resistor strings. Each switch of the multiplexer interconnects similar voltage nodes of each resistor string together to thereby average the voltage should the resistance values differ due to semiconductor process variations. The switch multiplexer also serves to select one resistor of each resistor string to couple the voltage thereacross to a sub-resistor string of the digital-to-analog converter.

19 Claims, 4 Drawing Sheets

OTHER PUBLICATIONS

"High Resolution A/D Conversion in MOS/LSI"l; Bahram Fotouhi and David A. Hodges; IEEE J. Solid State Circuits, vol. SC–14, pp. 920–926, Dec. 1979.

"Technological Design Considerations for Monolithic MOS Switched–Capacitor Filtering Systems", David J. Allstot and William C. Black, Jr., Proc.IEEE, vol. 71, pp. 967–968, Aug. 1983.

"Error Correction Techniques for High–Performance Differential A/D Converters", Khen–Sang Tan, Sami Kiriaki, Michiel De Wit, John W. Fattaruso, Ching–Yuh Tsay, W. Edward Matthews and Richard K. Hester; IEEE J. Solid State Circuits, vol. 25, No. 6, Dec., 1990.

"A 12–b 5–MSamples/s Two–Step CMOS A/D Converter", Behzad Razavi and Bruce A. Wooley,IEEE J. Solid State Circuits, vol. 27, No. 12, Dec. 1992.

"An IEEE 1451 Standard Transducer Interface Chip with 12–b ADC, Two 12–b DAC's, 10–kB Flash EEPROM, and 8–b Microcontroller", Tim Cummins, Eamonn Byrne, Dara Brannick and Dennis A. Dempsey, IEEE J. Solid State Circuits, vol. 33, No. 12, Dec. 1998.

* cited by examiner

METHOD OF FORMING D/A RESISTOR STRINGS WITH CROSS COUPLING SWITCHES

RELATED APPLICATION

This application is a Continuation application of U.S. patent application Ser. No. 09/584,217 entitled "D/A Resistor Strings with Cross coupling Switches," filed May 31, 2000 now U.S. Pat. No. 6,433,717 and is related to U.S. Pat. No. 6,384,763 entitled "Segmented D/A Converter with Enhanced Dynamic Range" and issued May 7, 2002 and U.S. Pat. No. 6,400,300 entitled "D/A Converter Street Effect Compensation" and issued Jun. 4, 2002.

TECHNICAL FIELD OF THE INVENTION

The present invention relates in general to digital-to-analog converters, and more particularly to the segmented type of converter having multiple resistor sections for carrying out the conversion process.

BACKGROUND OF THE INVENTION

In mixed signal circuits which involve both analog and digital signals, circuits are generally required for converting the analog signals into corresponding digital signals, and vice versa. Digital-to-analog converters provide an analog output as a function of the digital input. Many different varieties of conversion circuits are commercially available to satisfy the various constraints required, such a speed, resolution, differential non-linearity, monotinicity, etc. The digital-to-analog conversion process can be carried out according to different techniques, including the use of weighted current sources, R-2 ladder networks, as well as many other well-known conversion schemes. Because of the wide utilization of microprocessors employed to process digital information, it is a common practice to integrate digital-to-analog converters on the microprocessor chip. Because the use of chip area is always a concern, the minimization of components is therefore of paramount importance.

In a rudimentary digital-to-analog converter having a 12-bit resolution, as many as 4,096 series resistors can be utilized to produce a different magnitude of analog voltage in response to each of the 4,096 digital words. The amount of semiconductor space required for all these resistors would be prohibitively large. In addition to each resistor, there are required corresponding switches across each resistor for selecting voltage levels in response to different input digital combinations.

Figure 1:
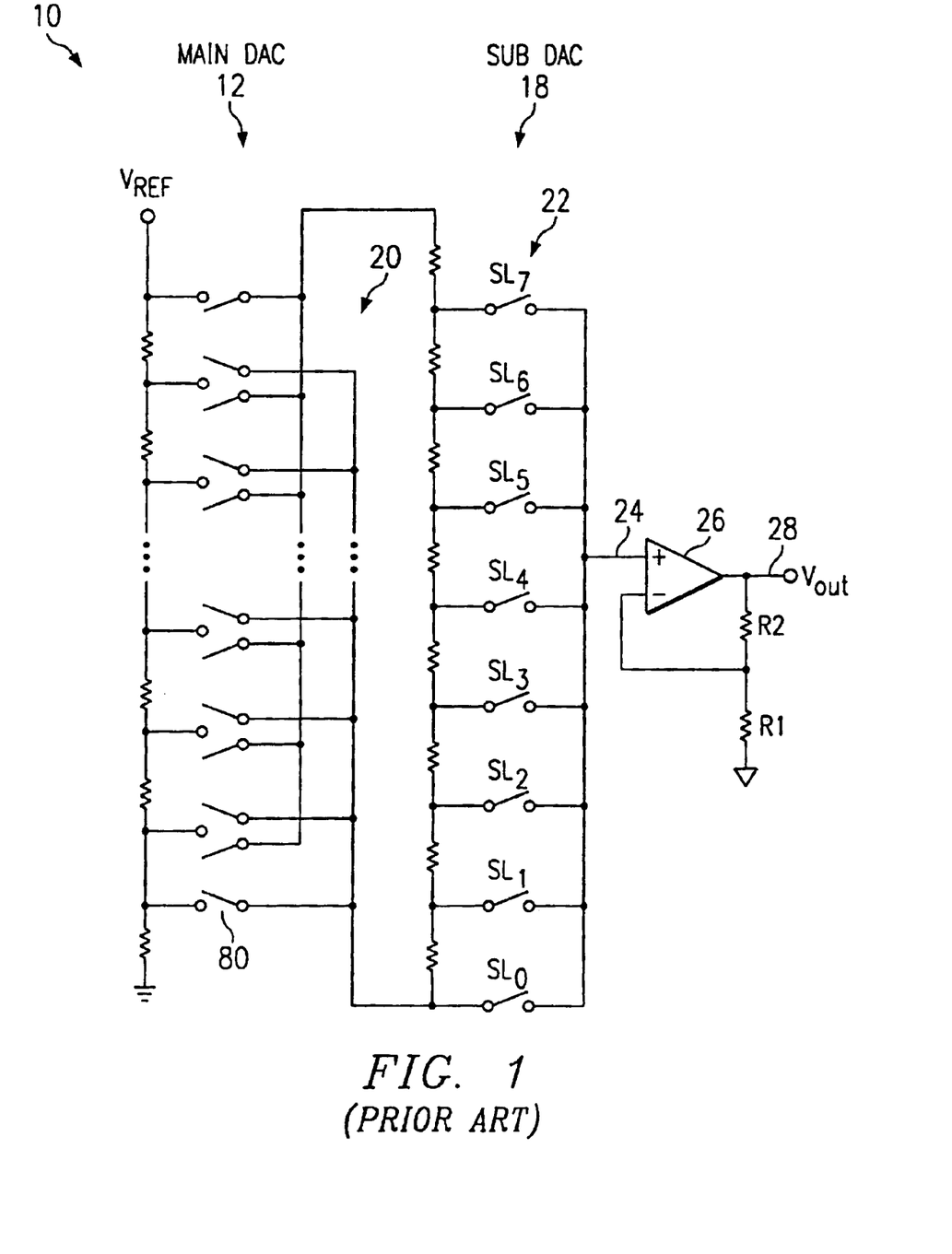
FIG. 1 illustrates a rudimentary digital-to-analog converter constructed according to prior art techniques.

A segmented digital-to-analog converter (DAC) provides an adequate solution to the problem of a large number of resistors to carry out the conversion algorithm. FIG. 1 of the drawings illustrates two resistor segments or strings of a 12-bit DAC 10. The digital-to-analog converter 10 includes a main DAC 12 and a subsidiary ("sub") DAC 18. The main DAC 12 includes a number of series resistors to provide $2^x$ different analog levels in response to X most significant digital bits.

A sub-DAC resistor string 18 includes a number of series-connected resistors to provide $2^y$ different analog levels for the least significant bits of the DAC 10. The DAC 10 includes X+Y digital input bits, and produces $2^{(x+y)}$ analog levels. A fewer number of resistors are required in a segmented DAC driven by a corresponding number of digital input bits.

A first switch multiplexer 20 is connected between the main DAC resistor string 12 and the sub-DAC resistor string 18. The switch multiplexer 20 is of conventional design for allowing the sub-DAC resistor string 18 to be connected in parallel to any one or more of the resistors in the main DAC resistor string 12. The switch multiplexer 20 is required to provide connections to $2^x$ different resistor combinations in the main DAC 12.

The sub-DAC 18 also includes a switch multiplexer 22 for selecting $2^y$ different resistance values. The output 24 of the second switch multiplexer 22 is connected to an operational amplifier 26. An output 28 of the amplifier 26 provides $2^{(x+y)}$ different analog outputs corresponding to the different combinations of the X+Y digital bits applied to the DAC 10.

While the switch connections between the main DAC resistor string 12 and the sub-DAC resistor string 18 provides a multiplying function and reduce the number of resistors required to complete the X+Y bit conversion, various shortcomings of this arrangement exist. For example, the coupling of the sub-DAC resistor string 18 to the main DAC resistor string 12 can present an unbalanced load thereon, as a function of the overall resistance of the sub-DAC resistor string 18. This can occur when the individual resistors of the string 18 are switched in or out of the circuit. When an unbalanced load is connected across the main DAC resistor string, a nonlinear conversion results. While FIG. 1 illustrates that only the main DAC resistor string 12 is supplied with a reference supply voltage, the same loading factor exists when the sub-DAC resistor string 18 is independently powered by a reference supply voltage. Various attempts have been made in the prior art to overcome this loading problem between the main and sub-DAC resistor strings. As noted in the background portion of U.S. Pat. No. 4,338,591 by Tuthill, there is proposed the remedy of placing a buffer amplifier between the main DAC resistor string and the sub-DAC resistor string. The buffer amplifiers do effectively isolate the main and sub-DAC resistor strings. But, substantial semiconductor area is required to isolate the resistor strings with a pair of buffer amplifiers. Also, the dynamic range of the main DAC is severely limited by the input range and the finite common mode rejection of the buffer amplifiers.

Instead of isolating the main DAC and the sub-DAC resistor strings with buffer amplifiers, the use of current sources is suggested in U.S. Pat. No. 5,703,588 by Rivoir et al. By utilizing a constant current to drive the main DAC and another constant current source to drive the sub-DAC, a balanced operation therebetween can be accomplished so that neither resistor string draws current from the other. The loading problem is thus alleviated, irrespective of the switch connections. When utilizing current sources, it is imperative that the output impedance thereof is some orders of magnitude higher than the voltage of the resistor string being driven. Otherwise, inaccuracies in the conversion process become significant, especially when large voltage excursions in the sub-DAC are experienced.

Current mirrors are well known for use as current sources and current sinks in DAC resistor strings. While accurate current control can be achieved, the output impedance of such a structure is not always as high as desired. Utilizing two transistors in series as either a current source or a current sink in a DAC resistor string could increase the output impedance of the current source by a factor of the gain of the second transistor. This solution can cause other problems.

It can be seen from the DAC 10 shown in FIG. 1 that, depending on the switch setting of the switch multiplexers 20 and 22, analog voltages very near the reference voltage, or very near the circuit common voltage (ground) can be coupled to the output amplifier 26. Unless expensive, precision instrumentation amplifiers are utilized, a wide dynamic input range (rail-to-rail) of amplifiers is not always available. However, it is most desirable to design DAC resistor strings that operate "rail-to-rail", otherwise wasted voltage ranges due to headroom resistors must be used. In other words, to reduce the dynamic range over which the amplifier must operate, resistors can simply be placed in series at the top and/or bottom of the DAC resistor strings. Such resistors waste power and require additional semiconductor area.

The accuracy in the conversion of the digital input to an analog output is a function of the values of the resistors with which the resistor strings are formed in the semiconductor material. While exact value resistors are difficult to form in integrated circuits, the repeatability of making a nominal resistance value is high.

The value of the DAC resistors themselves is only one consideration in forming or scaling accurate resistance values for the resistor strings. Another consideration is the contact resistance for each semiconductor resistor. Since each resistor has two contacts, there may be a contact resistance in series with each semiconductor resistor. U.S. Pat. No. 5,343,199 illustrates DAC resistor strings where the various segments of a resistor string are connected together by metal contacts. When utilizing resistors of different values, the contact resistance presents a problem when attempting to scale the resistor values. For example, if the resistance for each contact is 10 ohm. Then the total resistance for a nominal 1 k resistor would be 1,020 ohm. If it were desired to make one resistor that is exactly ten times the 1 k value, then the total resistance of that resistor would be 10,020 ohm. The scaling of semiconductor resistors is thus difficult. In various DAC resistor strings, the values of resistors can be multiples of the others, and thus it is difficult to make the resistors with any degree of precision.

Even when the contacts are not directly in series with the individual resistor elements of the resistor string, the process variations in forming the contacts to the various resistor elements can adversely affect the values of the resistors. In those situations when the resistor string itself is one continuous resistor formed as a polysilicon strip or some other resistive material, or otherwise, the formation of a contact or tap overlying and in electrical contact with the polysilicon strip may affect the resistance of that part of the polysilicon underlying the contact.

It has been found that the repeatability of resistors having desired values is affected by the location of the resistors on the semiconductor material, as a function of what electrical components are formed adjacent to the resistors. Resistors formed adjacent other resistors tend to be more uniform in value than resistors formed near different components, such as transistors, capacitors, etc. Hence, it has been found that by forming dummy resistors on each lateral side of a number of active resistors, the active resistors are better matched in value. While the formation of dummy resistors adjacent the active resistors improves the resistor value matching, additional semiconductor area is required for nonactive resistor components.

The variation in resistor values as a result of semiconductor processing is realized by those skilled in the art, and as set forth in U.S. Pat. No. 5,343,199 by Sugawa. Each resistor string of the D/A converter is fabricated as two separate resistor strings, but with various nodes of one resistor string short circuited to the same voltage nodes of the other resistor string. Moreover, the voltage strings are cross-connected in a reverse manner so that the supply voltage of one end of one resistor string is the ground end of the companion resistor string. In this manner, with variations in resistance values due to process differences, the nodes are forced to the same voltage by the metal cross connects. Although additional metal cross connects are required, as well as the semiconductor area required to accommodate the metalization, the non-linear conversion error is reduced. However, when a voltage is extracted at a node of the resistor string that is not short circuited to a similar-voltage node of the companion resistor string, there can still exist a nonlinear error due to the processing difference of resistors values.

It can be seen that a need exists for a DAC that utilizes current sources for isolating the DAC resistor strings, but where such current sources have a high output impedance, without substantially affecting the output rail-to-rail operation of the DAC. Another need exists for a digital-to-analog converter having a main DAC resister string and a sub-resistor string, and where the current which drives the main DAC resistor string is replicated in a specified ratio to the sub-resistor string. Another need exists for a DAC that utilizes resistors formed with a higher degree of repeatability to thereby enhance the accuracy of the conversion process.

SUMMARY OF THE INVENTION

A method is disclosed for forming resistor strings in a semiconductor material for a digital-to-analog converter having a main DAC resistor string and a sub-DAC resistor string. The main DAC resistor string is formed as two identical resistor strings connected in parallel and such that the bottom of one resistor string and the top of the other resistor string are connected to a first voltage. The other ends of the resistor strings are coupled to a second different voltage. A switch multiplexer serving two functions is connected between the resistor strings. Each switch of the multiplexer interconnects similar voltage nodes of each resistor string together to thereby average the voltage should the resistance values differ due to semiconductor process variations. The switch multiplexer also serves to select one resistor of each resistor string to couple the voltage thereacross to a sub-resistor string of the digital-to-analog converter.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 2:
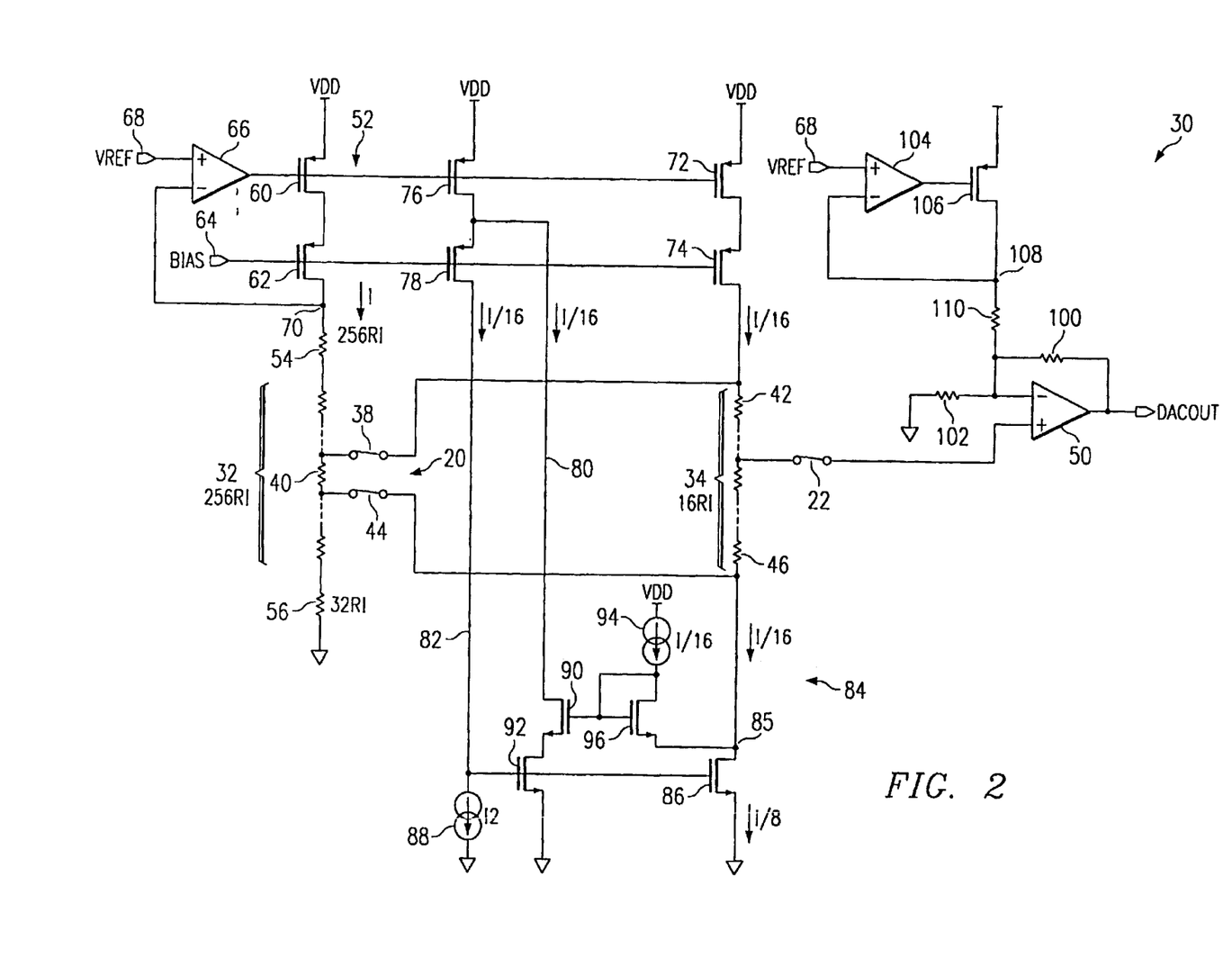
FIG. 2 illustrates the details of a DAC constructed according to the principles and concepts of the preferred embodiment of the invention.

FIG. 2 illustrates the details of the segmented DAC constructed according to a preferred embodiment. The DAC 30 incorporates a number of features, and overcomes the problems and disadvantages attendant with the prior art converters. The DAC 30 is shown with a main resistor string 32 comprised of two hundred fifty-six resistors, and a sub-resistor string 34 comprised of sixteen resistors. The main resistor string 32 can produce two hundred fifty-six different analog voltage levels, corresponding to the different combinations of eight most significant digital input bits. The sub-resistor string 34 can produce sixteen different analog voltage levels, corresponding to four least significant digital input bits. A 12-bit D/A conversion is thus achieved. According to an important aspect of the invention, each resistor of the main string 32 is fabricated with a nominal resistance value. Each resistor of the sub-resistor string 34 is also formed with the same nominal value resistance. In the preferred form of the invention, the nominal resistance value of each resistor is about seven hundred ohm.

A first switch multiplexer 20 is adapted for allowing the voltage across each resistor of the main resistor string 32 to be coupled across the sub-resistor string 34. The multiplexer switch 38 as shown is effective to couple the voltage at the top node of resistor 40 of the main resistor string 32, to the top node of the resistor 42 of the sub-resistor string 34. Switch 44 of the multiplexer 20 is effective to couple the voltage at the bottom node of main resistor string resistor 40, to the bottom node of the resistor 46 of the sub-resistor string 34. The switch multiplexer 20 is essentially identical to that well known in the art, as shown in FIG. 1 above, or in FIG. 3 of U.S. Pat. No. 5,703,588. As noted above, the plural switches of the multiplexer 20 are configured to provide switch connections to the various resistors to provide two hundred fifty-six different analog voltage levels across the conductors coupling the main resistor string 32 to the sub-resistor string 34.

A second switch multiplexer 22 is adapted for accessing voltages at the different resistor nodes of the sub-resistor string 34. Sixteen different switches of the second multiplexer 22 are adapted for accessing the analog voltage at sixteen different resistor nodes of the sub-resistor string 34. The voltage is coupled via only one closed switch of the multiplexor 22 to a non-inverting input of an output amplifier 50. With two hundred fifty-six different analog voltages provided by the main resistor string 32, and sixteen different analog voltages produced by the sub-resistor string 34, four thousand ninety-six (4,096) different analog voltages can be provided to the output amplifier 50. This corresponds to twelve bits of digital resolution. Those skilled in the art can readily understand the circuitry involved to convert the input digital signals to corresponding switch operations of both the main and sub-switch multiplexers 20 and 22.

As noted above, each resistor of the main resistor string 32, as well as the sub-resistor string 34, are constructed with a substantially identical resistance. More accurate analog voltage levels are thus achieved. Although not shown, each DAC resistor includes two contacts, but such contacts are not formed either in series with the resistor segments, or thereover. Thus, each resistor can be made with substantially the same value. As such, a much better match between the overall resistance values of the main and sub-resistor strings is achieved.

The main resistor string 32 is driven by a precision reference voltage. Based on the composite resistance of the main DAC resistor string, a current of specified magnitude flows therethrough. The sub-resistor string 34 is driven by a current source. As noted above, a high impedance current source is desirable in order to further isolate any changes in supply voltage and render the same independent of the output voltage obtained from the resistor strings. The output impedance of current source transistor 72 is increased by a factor defined by the gain of cascode-connected transistor 74.

The main resistor string 32 draws current through a pair of series-connected transistors 60 and 62. These transistors mirror the current in the main resistor string 32 in a desired ratio to the sub-resistor string 34. The manner in which the respective transistors 60 and 72, as well as transistors 62 and 74 are interconnected, assures that the current that drives the main resistor string 32 is replicated in the manner noted to the sub-resistor string 34. A current I is driven through a headroom resistor 54, through the main resistor string 32, and finally through an offset resistor 56. The headroom resistor 54 is not part of the main resistor string 32 in terms of producing an analog voltage level for D/A conversion, but functions to provide a headroom voltage for the current source at the top of the resistor string 34. In the preferred form of the invention, the headroom resistor 54 is of the same value as the composite resistance of the main resistor string 32. The offset resistor 56 is preferably a smaller value than the headroom resistor 54. In one aspect of the invention, the offset resistor 56 is one-eighth (⅛) the value of the headroom resistor 54. The function of the offset resistor will be described in more detail below.

As noted above, series-connected transistors 60 and 62 form a cascode transistor circuit for supplying a current of the value I to the main resistor string 32. The transistors 60 and 62 also form a circuit for mirroring the current therethrough to the sub-resistor string 34. A bias voltage 64 supplies a voltage to the gate of transistor 62. An operational amplifier 66 drives the gate of transistor 60 with a voltage. The non-inverting input of the operational amplifier 66 is connected to a reference voltage 68. The inverting input of the amplifier 66 is connected to the junction 70 between the headroom resistor 54 and the source terminal of current source transistor 62. With this arrangement, the junction 70 is maintained at the reference voltage Vref. The precision voltage Vref is maintained at the junction 70 of the main resistor string 32. The current I which drives the main DAC resistor string 32 is thus a function of the magnitude of the reference voltage at node 70, plus the composite resistance of the headroom resistor 54, the resistance of the main DAC resistance string, and the resistance of the offset resistor 56. As can be appreciated, this current may change because of temperature considerations, the switched resistor connections to the sub-resistor string, reference voltage variations, changes in parameters of the main resistor string, etc. What is important is that because of the mirroring of the current from the main DAC resistor string 32 to the sub-resistor string 34, and change in the former is reflected in the latter. The maintenance of this current relationship reduces any loading affect that the sub-resistor string 34 would otherwise have on the main DAC resistor string 32.

The sub-resistor string 34 is driven by a mirroring current source. The sub-resistor string current source constitutes a series-connected transistor arrangement to thereby increase the output impedance thereof Series-connected transistors 72 and 74 provide a very high output impedance to the sub-resistor string 34. The headroom resistor 54 in the main DAC resistor string 32 allows the current source transistors 72 and 74 to operate in an acceptable voltage range to supply a mirrored current to the sub-resistor string 34. Although the dynamic range of operation of the main resistor string 32 and the sub-resistor string 34 are limited because of the headroom resistor 54, such limited dynamic range is overcome in a manner set forth below.

Since the headroom resistor 54 is the same value as the composite resistance of the main resistor string 32, the headroom resistor 54 serves an additional important role in maintaining the matching accuracy of the main DAC resistor string 32. Because of the variations in semiconductor manufacturing process, dummy resistors are often placed around the actual resistor to compensate for the street effect in order to maintain electrically good resistor matching properties. However, dummy resistors are otherwise nonfunctional and require additional silicon area and thus increase the manufacturing cost. As will be described more fully below, the resistor 54 functions as both the headroom resistor and the street effect compensation resistors. Therefore, no silicon area is unnecessarily wasted on dummy resistors alone.

Forming a part of the mirrored current source associated with the sub-resistor string 34 is an additional pair of series-connected transistors, namely transistor 76 and transistor 78. Much like current supply transistor 60 which drives the main resistor string 32, the transistors 72 and 76 associated with the sub-resistor string 34 are driven by the output of the operational amplifier 66. In like manner, transistors 74 and 78 associated with the sub-resistor string 34 are driven by the bias voltage 64. The conduction channel width of current source transistors 72 and 74 are constructed to provide a mirrored current of I/16, as compared to main resistor string current supply transistors 60 and 62 which supply a current I. The reason for this current difference by a factor of sixteen is that the composite resistance value of the sub-resistor string 34 is sixteen times the resistance value of a selected main string resistor, such as resistor 40. By maintaining this current ratio between the main and sub-resistor strings, the current flow therebetween is reduced, as is the loading therebetween. As noted above, each resistor of the main resistor string 32 is of the same value, and can be individually selected by respective switches of the switch multiplexer 20. Current source transistor 76 is structured to provide a current of I/8, one half of which is carried on conductor 80, and one half of which is carried through transistor 78. Transistor 78 and conductor 82 thus each carry a current of I/16.

A regulated current sink 84 functions to provide a high output impedance to the current sink, while using only a single current sink transistor 86 in series with the sub-resistor string 34. The current carried through series transistor 86 is regulated as a function of an amplifier defined by transistors 76 and 78, as well as current sources 88 and 94, and transistors 90, 92 and 96. The output of the amplifier is connected to the gate of transistors 92 or 86. The current flowing through transistor 92 and the output of the amplifier define a negative feedback loop which forces the current carried by transistor 92 to be equal to the difference between the current source 88 and the current of transistor 76. The current that flows through transistor 92 is mirrored in transistor 86 by a ratio of 1:2. Hence, a current of magnitude I/16 flows through transistor 92, thereby causing a current of magnitude I/8 to flow through current sink transistor 86. The amplifier and feedback arrangement associated with current sink transistor 86 substantially increase the output impedance thereof, without requiring a substantial voltage swing for operation thereof.

The voltage developed across the offset resistor 56 connected at the bottom of the main resistor string 32 provides the operating voltage range for the current sink transistor 86. As noted above, the current sink transistor 86 is regulated to maintain a constant current of I/8 therethrough. As also noted above, transistors 92 and 86 form a current mirror such that series current sink transistor 86 maintains twice the current therethrough, as compared to transistor 92. The current source 88 maintains a bias on the gate of transistor 92 such that the current I/16 is maintained through transistor 92.

In the amplifier feedback circuit, the current source 94 creates a constant current of I/16 that is carried through transistor 96. The current I/16 carried by transistor 96 as well as the current I/16 carried through the sub-resistor string 34, are combined and carried through the current sink transistor 86 as current I/8. The transistors 96 and 90 force the voltage on node 85 equal to the voltage on the drain of transistor 92. Thus, current sink transistor 86 has the exact replica bias condition as transistor 92. Once the current through the transistor 92 is established via the negative feedback, the current is mirrored to the current sink transistor 86. As noted above, the conduction channel of transistor 86 is twice that of transistor 92, whereby transistor 86 carries twice the current sources, i.e., I/8. The current sources 94 and 88, the transistors 90, 96 and 76 not only maintain a constant current through current sink transistor 86, but also multiply the output impedance thereto. The output impedance of current sink transistor 86 is multiplied by a factor of about 100, due to the negative feedback amplifier arrangement. By utilizing only a single current sink transistor 86, in conjunction with the feedback amplifier, the operational voltage thereacross is much smaller than the cascode-connected current sources connected at the top portion of the main resistor string 34. With this arrangement, the current sink transistor 86 can operate with as little as 0.1 volt of drain-source voltage. As noted above, the voltage across the offset resistor 56 determines the range of operating voltage across the current sink transistor 86.

From the foregoing, the main resistor string 32 and the sub-resistor string 34 of the D/A converter are driven by mirrored currents to maintain an isolation between the resistor strings so that improved conversion accuracy is achieved. In addition, a high impedance output current source and sink are provided in the sub-resistor string 34 to provide a high degree of isolation at the respective top and bottom thereof, as well as to improve the current regulation therethrough.

As noted above, the resistor 54 located in the main resistor string 32 provides operational headroom for the cascode-connected current sources, as well as device matching properties. Because the value of the headroom resistor 54 is the same as the composite resistance of the main resistor string 32, the dynamic range of the analog voltages generated in the conversion circuit is about half the reference supply voltage. Although the offset resistor 56 further reduces the dynamic range, its value is one-sixteenth (1/16) that of the combined resistance of the headroom resistor 54 and the main resistor string 32. In practice, the dynamic range of the analog voltage generated in the main DAC is about 0.4706 times the reference voltage Vref. A wide operating voltage range is reestablished in the configuration of the output amplifier.

The output analog voltage resulting from the digital conversion is carried by way of the second switch multiplexer 22 to the non-inverting input of the output amplifier 50. The feedback resistor 100 and the input resistor 102 of the amplifier 50 are of the same resistance value. The value of resistor 110 is eight times the resistance value of either resistor 102 or 100. By configuring the amplifier 50 as the non-inverting amplifier, the gain thereof then becomes 2.125. Hence, because the dynamic range of the analog voltages generated by the resistor strings 32 and 34 is about 0.4706 times the reference supply voltage, the amplifier 50 increases the amplitude of the analog signals by a factor of 2.125, thereby reestablishing the full dynamic range of the converted analog voltage. An output voltage swing of the amplifier 50 from rail to rail is thus reestablished.

Configured much like operational amplifier 66, the amplifier 104 drives transistor 106 so that a reference voltage of Vref is maintained at node 108. The reference voltage biases the resistor 110 connected to the inverting input of the output amplifier 50. As noted above, the value of resistor 110 is eight times that of either resistor 100 or 102. The value of resistor 110 with regard to resistor 100 shifts the operating point of the output amplifier 50, thereby overcoming the effect of the offset voltage generated by offset resistor 56.

From the foregoing, a high precision integrated digital-to-analog converter has been disclosed. The resistor elements of both the main resistor string and the sub-resistor string are of identical nominal values, thereby improving the accuracy of the analog voltage levels generated by the resistor strings. The main DAC resistor string is driven by a precision reference buffer circuit where a reference current is generated. By utilizing high impedance current sources and replicating the current from the main DAC resistor string, a highly accurate sub-DAC output is achieved. From a matching perspective, the headroom resistor improves the accuracy of the main DAC resistor string by also functioning effectively as street compensation components.

Figure 3:
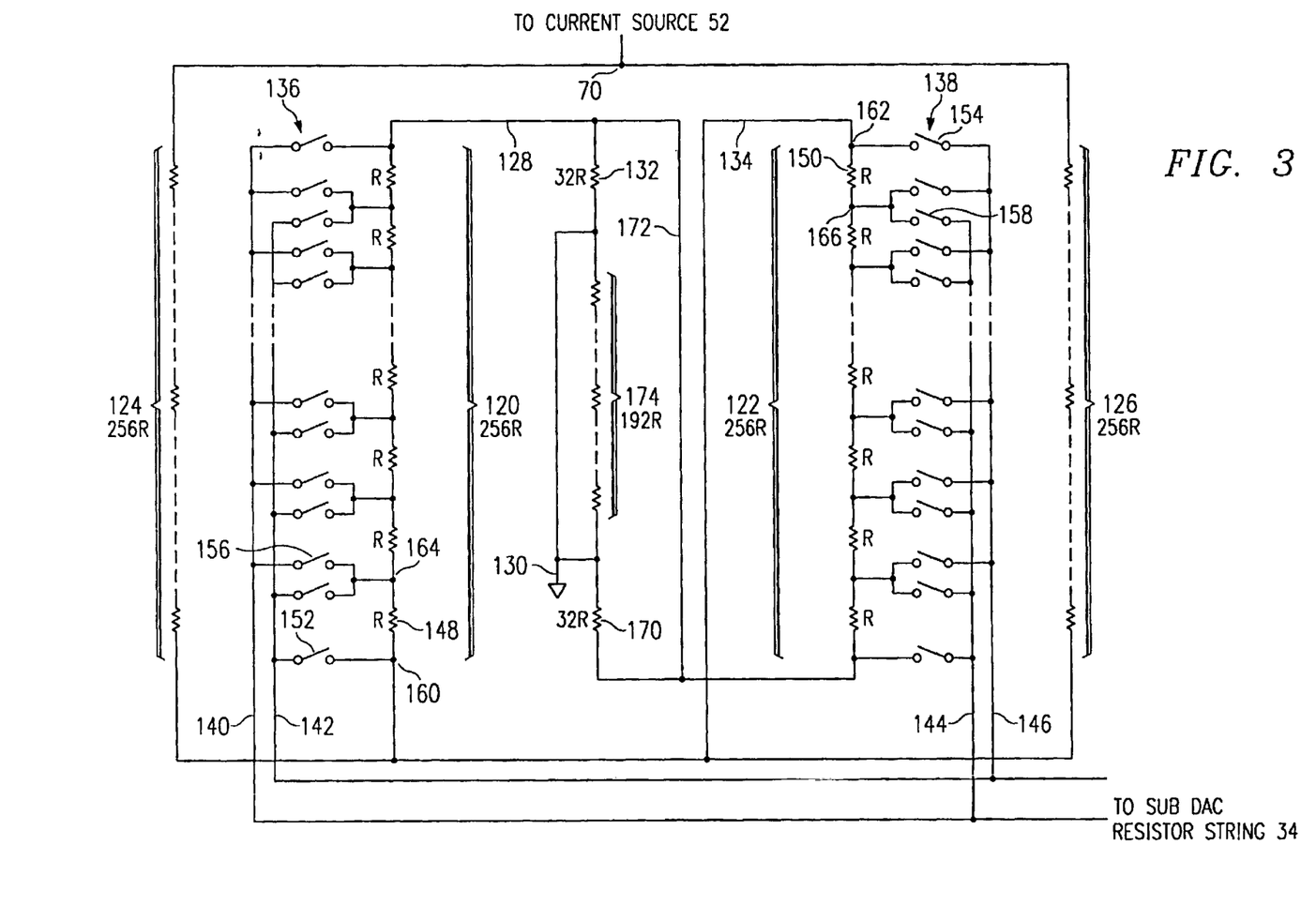
FIG. 3 illustrates the relative physical layout of a headroom resistor that also functions as a dummy resistor to the main DAC resistor string.

FIG. 3 illustrates the physical layout of the various resistors of the main DAC resistor string 32. In practice, the resistor string 32 of FIG. 2 is fabricated as two distinct resistor strings, one identified as reference numeral 120 in FIG. 3 and the other identified as reference numeral 122. The headroom resistor 54 of FIG. 2 is also fabricated as two distinct resistors, one identified as reference numeral 124 and the other identified as reference numeral 126. It can be seen that the headroom resistor 124 is in a series with the main DAC resistor string 120. In like manner, the headroom resistor 126 is in series with the companion main DAC resistor string 122. Each of the main DAC resistor strings 120 and 122 are fabricated with 256 individual resistors of identical value. Each headroom resistor 124 and 126 is similarly fabricated with 256 identical-valve resistors each. The top end of each headroom resistor 124 and 126 is connected to node 70 of FIG. 2. Node 70 is driven by the reference buffer 52, and a current supply source defined by transistors 60 and 62 to provide low impedance output to the main DAC resistor strings 120 and 122.

In accordance with an important aspect of the invention, the resistor string 120 is fabricated as polycrystalline silicon, with the headroom resistor 124 located adjacent thereto. To that end, the headroom resistor 124 provides the function of establishing a sufficient voltage operating range for the current sources of the sub-resistor string 34, as well as functions to provide a dummy resistor for the main DAC resistor string 120. As noted above, the utilization of the headroom resistor 124 adjacent the main DAC resistor string 120 compensates for the street effect. Similarly, the other headroom resistor 126 functions both to provide the requisite voltage operating range for the sub-resistor string current sources, as well as dummy resistors for the main DAC companion resistor string 122. Because the headroom resistors 124 and 126 function to provide two different features, a reduction in the number of resistors is achieved, thereby reducing the semiconductor area utilized, as well as the expense in fabrication of the device.

In order to further reduce the variations in the resistance values of the main DAC resistor strings 120 and 122, the top end 128 of the resistor string 120 is connected to circuit ground 130 via the offset resistor 132. In contrast, the top 134 of the main DAC companion resistor string 122 is connected to the reference voltage Vref through the headroom resistor 126. Rather than cross connecting the nodes of the resistor strings 120 and 122 that are of similar voltages with metal conductors, such nodes are interconnected by way of transistor switches. Indeed, the transistor switches also serve dual purposes. First, the transistor switches function to interconnect resistor string nodes of similar voltages, as well as provide a decoding function for selecting a resistor of each main DAC resistor string for coupling the voltage thereof to the sub-resistor string 34.

A first switch multiplexer 136 includes a number of transistor switches that are connected across each resistor of the main DAC resistor string 120. A second switch multiplexer 138 includes a similar number of transistor switches connected across each resistor of the main DAC companion resistor string 122. Various switches of the first switch multiplexer 136 are connected to a first conductor 140 that is coupled to one end of the sub-resistor string 34. Other switches of the first multiplexer 136 are connected to another conductor 142 that is coupled to the other end of the sub-resistor string 34. The second switch multiplexer 138 is similarly connected to select individual resistors of the main DAC companion resistor string 122. Some of the switches 138 are connected to a third conductor 144, and the remainder of the switches of the second switch multiplexer 138 are connected to the common conductor 146. Importantly, conductor 140 of the first switch multiplexer 136 is connected to the conductor 144 of the second switch multiplexer 138. In like manner, the common conductor 142 of the first switch multiplexer 136 is connected to the conductor 146 of the second switch multiplexer 138.

The switches of the first multiplexer 136 and the second multiplexer 138 are operated by a decoder (not shown) in such a manner that the switches operate together so that resistor 148 of the resistor string 120 is selected together at the same time with resistor 150 of companion resistor string 122. In other words, the decoder functions to close transistor switch 152 together with transistor switch 154, as well as close transistor switch 156 together with transistor switch 158. By operation of these switches, resistor string node 160 is short circuited to resistor string node 162. Resistor string node 164 is connected via the switches to resistor string node 166. If the two resistor string nodes have different voltages, due to resistor process variations, the two voltages will be averaged and the result thereof output from the resistor string. By connecting together the resistor string nodes of the selected resistors, non-linear conversion errors are reduced. In addition, the switches 136 and 138 also serve to couple the voltage across the parallel-connected resistors 148 and 150 to the sub-resistor string 34 (FIG. 2). The other switches of the first multiplexer 136 as well as the other switches of the second multiplexer 138 are effective to select each resistor of the 256 resistors to place the same in parallel, as well as to couple the voltage thereacross to the sub-resistor string 34. With this arrangement, each and every node of the resistor strings 120 and 122 can be connected together when selected to reduce the non-linear errors and to couple the selected voltage to the sub-resistor string 34. In practice, when the resistor strings 120 and 122 are connected together through two transistor switches, it is not necessary that the two switches have zero resistance. If the switches have a finite resistance, the switches will still average or interpolate the voltage between the two resistor nodes.

Not only is the headroom resistor 54 (FIG. 2) formed as two distinct resistors 124 and 126, but the offset resistor 56

(FIG. 2) is also fabricated as separate polysilicon resistors 132 and 170. The respective ends of the offset resistors 132 and 170 are connected to circuit ground 130. Offset resistors 132 and 170 are connected in parallel as a result of conductor 172 which short circuits together one end of each of the offset resistors 132 and 170.

One hundred and ninety-two dummy resistors 174 are fabricated as polysilicon resistors in line with the offset resistors 132 and 170. The number of offset resistors 132 and 170, together with the dummy resistors 174, total 256 resistors in all. This combination of resistors is physically located between the first main DAC resistor string 120 and the companion main DAC resistor string 122. As such, the offset resistors 132 and 170 and the dummy resistors 174 provide street compensation for the resistor strings 120 and 122. It should be noted that the top end and the bottom end of the dummy resistor string 174 is short circuited to ground. Thus, unlike the offset resistors 132 and 170 which provide dual functions, the dummy resistors 174 provide the sole function of street compensation for the main DAC resistor strings 120 and 122.

Figure 4:
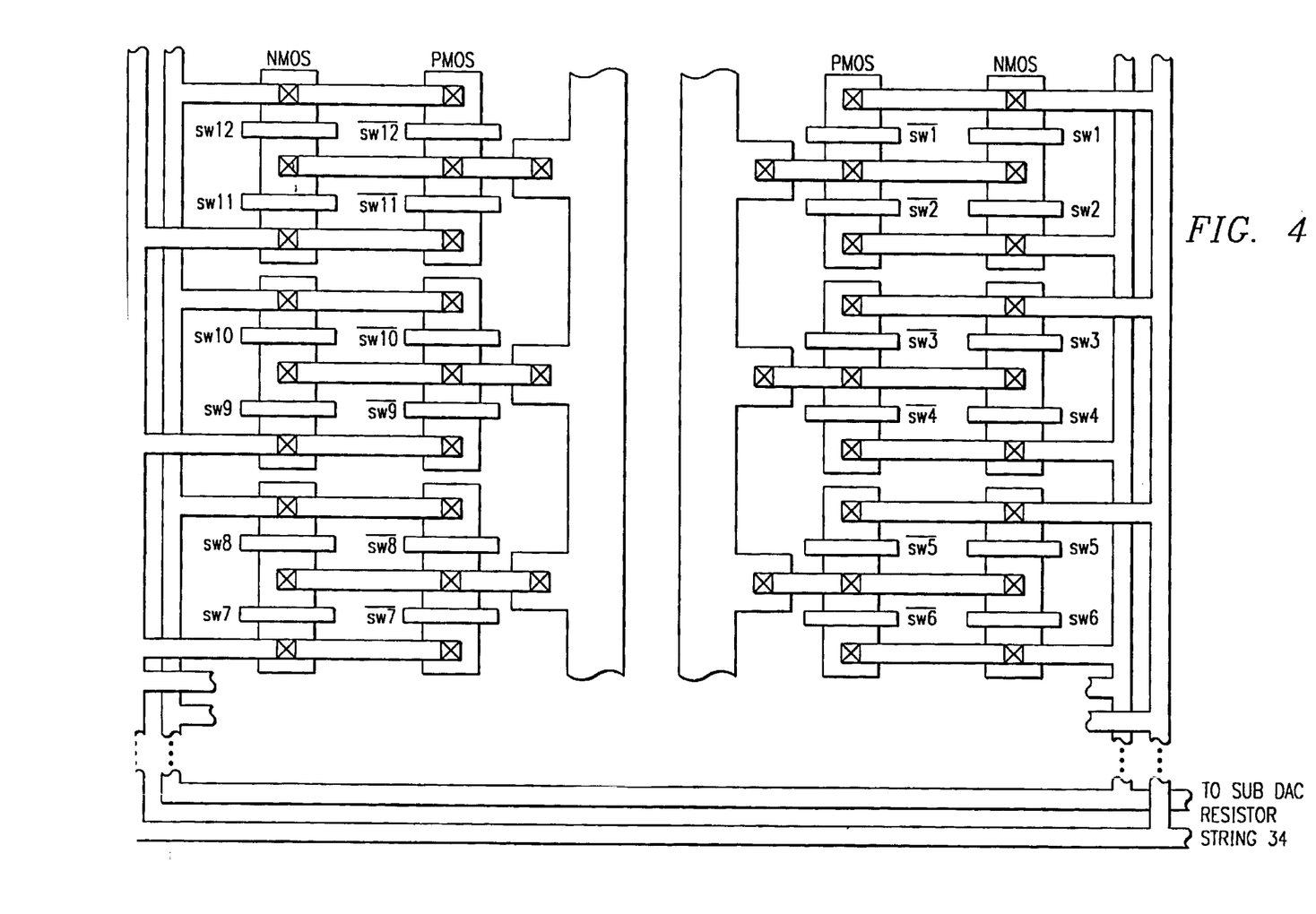
FIG. 4 illustrates a physical layout of the main DAC resistor string, and its companion resistor string, with the switch multiplexer implemented as corresponding transmission gates.

FIG. 4 illustrates a layout showing the manner in which the main DAC resistor strings 120 and 122 are cross connected by way of the first switch multiplexer 136 and the second switch multiplexer 138. Only a portion of the resistor strings 120 and 122 and the corresponding switch multiplexer are shown. For purposes of clarity, the other functional and dummy resistors of the main DAC are not shown. As can be seen, the resistor string 120 is a continuous strip of polycrystalline silicon of a desired resistivity. In practice, the resistor 120 is masked so as to be serpentine-shaped, as is customary. Importantly, the polysilicon resistor strip 120 includes a number of lateral arms 180 for forming a contact 182 thereto. The contact 182 is not formed over or in the main resistor strip 120. Thus, current flowing through the main resistor strip 120 is not affected by any irregularity in the resistance that may be caused by the contact 182. As noted above, a much smaller magnitude of current, if any, flows through the contact 182, as compared to the resistor strip 120.

The contact 182 is connected to a conductor 184 that is connected to a PMOS transistor 186 and an NMOS transistor 188. The transistors 186 and 188 define a first set of transistors comprising a transmission gate for selectively coupling the junction 180 of the resistor strip 120 to the common conductor 140. The second set of transistors comprising a PMOS transistor 190 and an NMOS 192 constitute a second transmission gate for coupling the junction 180 of the resistor strip 120 to the other common conductor 142. The gate terminals of the four transistors, one shown as reference numeral 194, are coupled to the decoding circuits (not shown) that control which resistor of the main DAC resistor string 120 is to be selected and the voltage thereacross coupled to the sub-resistor string 34. The gates of the PMOS transistors and the NMOS transistors are driven by complementary signals. Each of the other arms or junctions of the resistor string 120 is switched to a similar pair of transmission gates to the respective common conductors 140 and 142. The second switch multiplexer 138 includes similar pairs of transmission gates for coupling the junctions of the companion resistor string 122 to the common conductors 144 and 146. The common conductor 140 of the first switch multiplexer 136 is connected to the common conductor 144 of the second switch multiplexer 138. In like manner, the common conductor 142 of the first switch multiplexer 136 is connected to the common conductor 146 of the second switch multiplexer 138. Hence, the first switch multiplexer 136 and the second switch multiplexer 138 not only short circuit together nodes of the resistor strings 120 and 122 that are of similar voltage, but also couple the voltage across the selected resistors to the sub-resistor string 34.

Although the preferred embodiment has been described in detail, it should be understood that various changes, substitutions and alterations can be made therein without departing from the spirit and scope of the invention, as defined by the appended claims.

What is claimed is:

1. A method for forming a resistor circuit in a semiconductor material, comprising:

connecting a first plurality of resistors in series between different fixed voltage potentials, the first plurality of resistors having a first end terminal and a second end terminal, and the resistors connected together at respective nodes therebetween;

connecting a second plurality of resistors in series between different fixed voltage potentials, the second plurality of resistors having a first end terminal and a second end terminal, and the resistors of the second plurality connected together at respective nodes therebetween;

switchably connecting one of a plurality of switches between a first node selected from one of the respective nodes of the first plurality of resistors and a second node selected from one of the respective nodes of the second plurality of resistors, respective nodes of the first and second plurality of resistors being of similar voltage before the first and second nodes are connected by the one of the plurality of switches, whereby effects of different values of the resistors due to semiconductor process variations are reduced; and connecting the first and second connected nodes to an output.

2. The method of claim 1, further including the step of taking plural outputs of the resistor circuit at various said nodes.

3. The method of claim 2, further including the step of providing an output at each node of the one first or second plurality of resistors.

4. The method of claim 1, further including the step of incorporating the resistor circuit in combination with a D/A converter such that the output comprises the input to the D/A converter.

5. The method of claim 2, further including the step of connecting the first and second nodes to place each resistor in the first plurality of resistors in parallel with a respective resistor of the second plurality of resistors.

6. The method of claim 5, further including the step of connecting the plurality of switches to a pair of common conductors so that a voltage developed across the parallel resistors is provided as an output of the resistor circuit.

7. The method of claim 2, wherein the plurality of switches comprises a first plurality associated with the first plurality of resistors, and a second plurality of switches associated with the second plurality of resistors.

8. The method of claim 7, further including the step of connecting the first and second plurality of switches together with two conductors.

9. The method of claim 1, wherein the plurality of switches each comprise transmission gates.

10. The method of claim 1, further including the steps of:

coupling the first end terminal of the first plurality of resistors to a first voltage potential;

coupling a second end terminal of the first plurality of resistors to a different voltage potential;

coupling the first end terminal of the second plurality of resistors to the different voltage potential; and coupling the second end terminal of the second plurality of resistors to the first voltage potential.

11. The method of claim 10, further comprising the step of forming the first plurality of resistors in the semiconductor material so that the first end of the first plurality of resistors is adjacent to the second end of the second plurality of resistors, and the second end of the first plurality of resistors is located adjacent the first end of the second plurality of resistors.

12. The method of claim 1, further including the step of forming a dummy resistor string in association with the first and second plurality of resistors to provide street compensation.

13. The method of claim 1, wherein the plurality of switches each comprise transmission gates and further include a pair of common conductors, and further including the step of coupling one transmission gate between a resistor node and one common conductor and coupling a second transmission gate between the resistor node and the other common conductor.

14. The method of claim 13, further including the step of providing a decoding circuit for selectively actuating the switches based on a digital input to the decoding circuit, whereby a digital-to-analog conversion is carried out.

15. The method of claim 1, wherein further including the step of converting the same digital bits to a corresponding analog voltage in the first and second plurality of resistors.

16. The method of claim 15, further including the step of coupling each analog voltage output by the resistor circuit from nodes connected together by the switches to an output of the resistor circuit.

17. The method of claim 1, further including the step of driving one end terminal of each said and second plurality of resistors only by a constant source of power.

18. The method circuit of claim 1, further including the steps of:

arranging first and second plurality of resistors in parallel resistor strings;

coupling together through first and second sets of the switches;

respective nodes of each resistor string and connecting an output of the resistor circuit having a respective conductor to each first and second set of switches to define an analog voltage across the respective conductors.

19. The method of claim 1, wherein the resistor circuit comprises a first resistor circuit responsive to MSB bits to be converted, and further including a third plurality of resistors connected in series, and an output of said first resistor circuit is coupled to said third plurality of resistors to convert LSB bits.

* * * * *